United States Patent

Koduri

[11] Patent Number: 6,065,663
[45] Date of Patent: May 23, 2000

[54] ALIGNMENT APPARATUS FOR WIRE BONDING CAPILLARY

[75] Inventor: Sreenivasan K. Koduri, Dallas, Tex.

[73] Assignee: Texas Instruments Incorporated, Dallas, Tex.

[21] Appl. No.: 08/993,632

[22] Filed: Dec. 18, 1997

Related U.S. Application Data

[60] Provisional application No. 60/034,075, Dec. 19, 1996.

[51] Int. Cl.[7] .............................. B23K 37/00; B23K 1/06; B23K 3/02; B32B 31/00
[52] U.S. Cl. .............................. 228/4.5; 228/1.1; 228/55; 228/110.1; 156/580.1; 310/323; 310/328
[58] Field of Search ................................. 228/1.1, 4.5, 55, 228/110.1, 180.5; 156/73.2, 580.1; 310/323, 328

[56] References Cited

U.S. PATENT DOCUMENTS 4,230,925  10/1980  Lascelles ................................. 219/56.1
5,544,804  8/1996  Test et al. .
5,699,951  12/1997  Miyoshi ................................. 228/4.5
5,829,663  11/1998  Khelemsky et al. .................... 228/1.1

*Primary Examiner*—Patrick Ryan
*Assistant Examiner*—Kiley Stoner
*Attorney, Agent, or Firm*—Wade James Brady, III; Richard L. Donaldson

[57] ABSTRACT

An alignment apparatus is provided for ensuring proper positioning of a wire bonding capillary during installation of the wire bonding capillary onto the horn of a wire bonding machine. The apparatus ensures that the capillary is in a correct position relative to its longitudinal axis and is also in a desired rotational position with respect to the horn. The apparatus includes a first arm and a second arm which are movable toward each other to engage an outer surface of the horn thereby gripping the horn between the first and second arms. The apparatus also includes a support for holding the capillary. When the apparatus is properly positioned on the horn the support holds the capillary in a predetermined position in which the capillary is properly aligned with respect to the horn. A locking mechanism of the horn may then,be used to lock the capillary onto the horn.

17 Claims, 2 Drawing Sheets

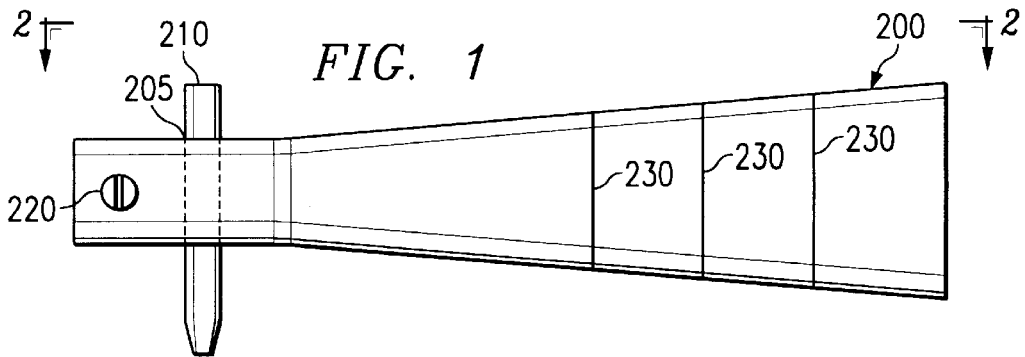
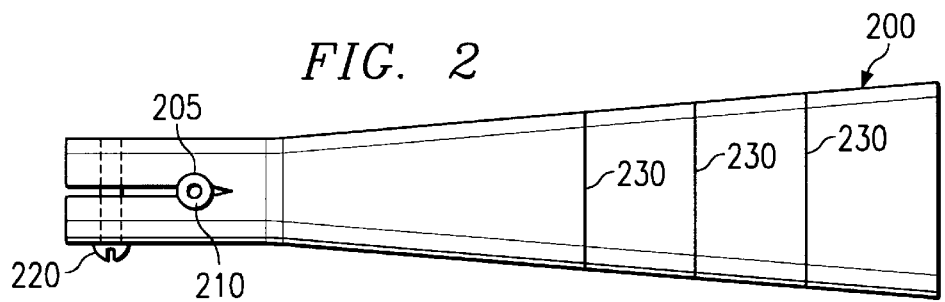
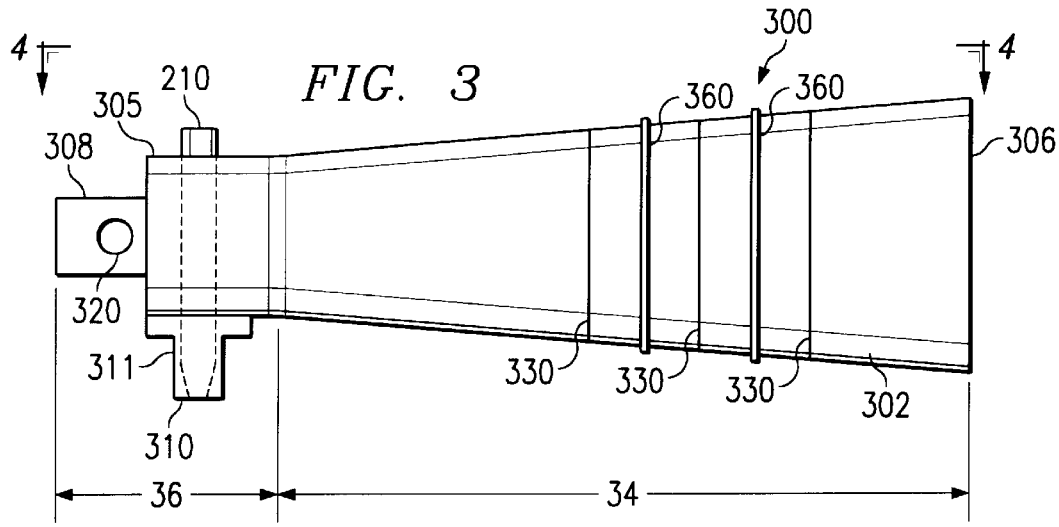
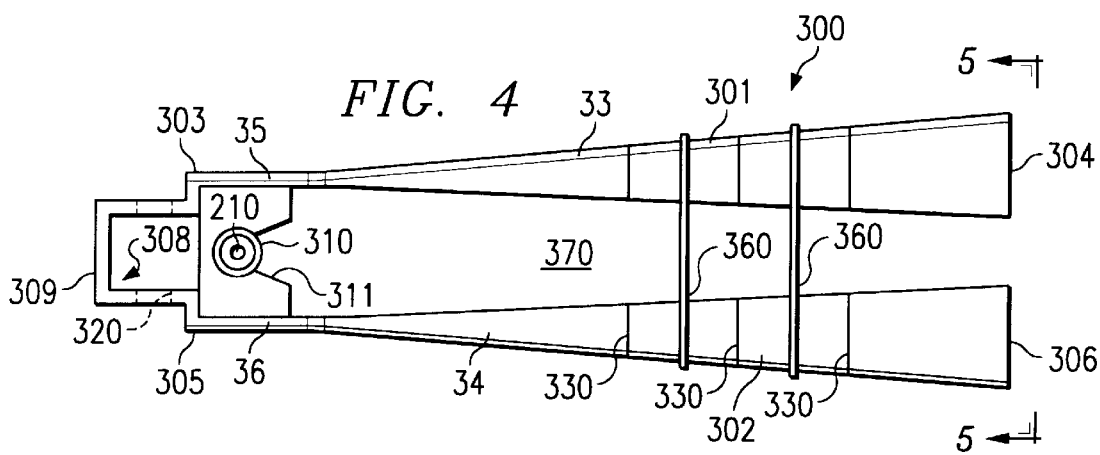

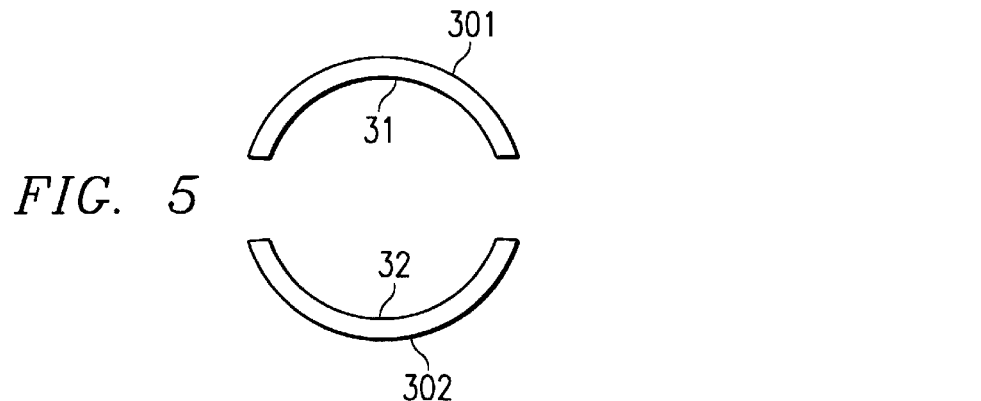
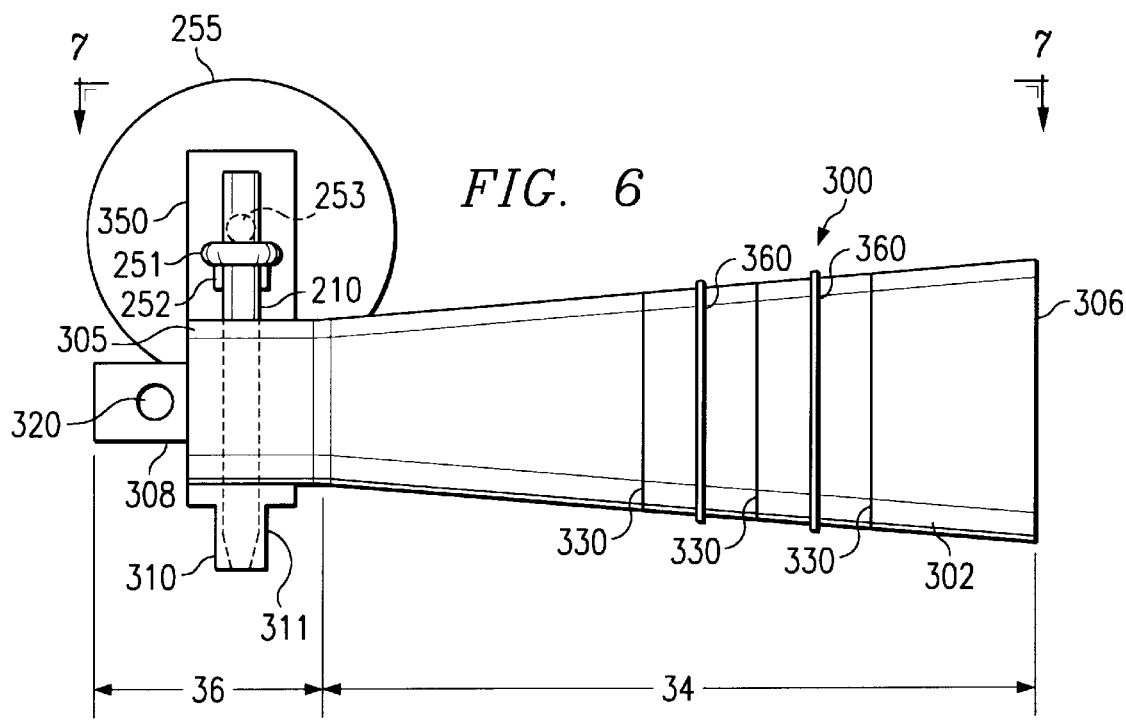
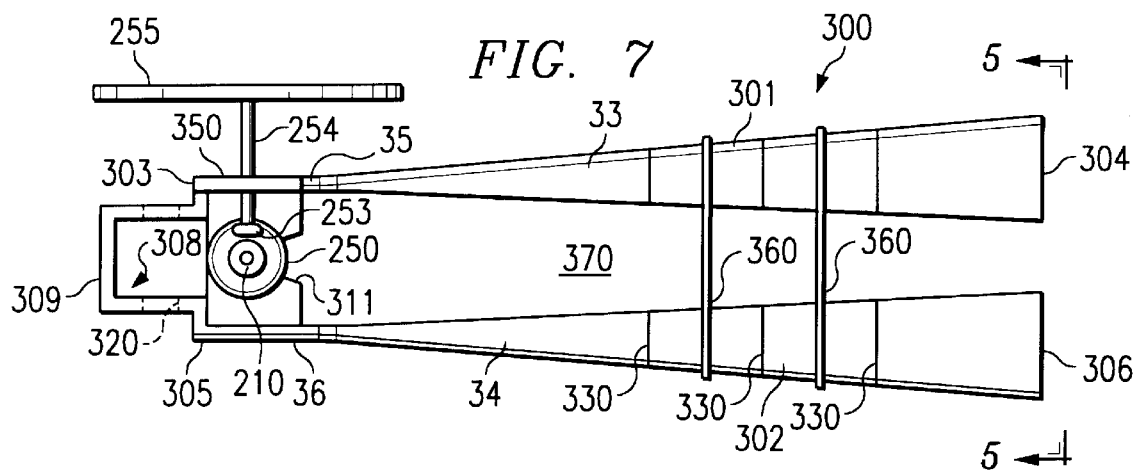

ALIGNMENT APPARATUS FOR WIRE BONDING CAPILLARY

This application claims priority under 35 used 119(e)(1) of provisional application Ser. No. 60/034,075 filed Dec. 19, 1996.

TECHNICAL FIELD OF THE INVENTION

The present invention generally relates to capillaries used in the wire bonding process during the manufacture of electronic integrated circuit chip packages and, more particularly, to an alignment apparatus for a wire bonding capillary.

BACKGROUND OF THE INVENTION

Integrated circuit chip packages are typically formed by mounting an integrated circuit chip on a lead frame and coupling these two elements to form a package. The integrated circuit chip and lead frame may be encapsulated. Typically, the chip includes a number of bond pads which may be positioned about a perimeter of the chip according to a predetermined spacing between the bond pads. The lead frame typically includes a number of leads about a perimeter thereof. One type of lead frame, for example, has a generally rectangular shape with each side of the rectangle having a number of leads. The leads may each have a relatively narrow elongated shape.

A lead frame may be said to have an X direction and a Y direction. The X direction is perpendicular to one pair of opposing sides and the Y direction is perpendicular to the other pair of opposing sides. Typically, each lead has a relatively narrow elongated shape defining a lead axis. The lead axis for any given lead frame may extend in the X or Y direction, or be offset by an angle from either the X or Y direction. The angle of offset may vary from lead to lead. Moving from the center of a given side of the lead frame toward the corner leads, the lead axes may be angularly offset from perpendicular by increasing amounts. Also, a bonding path is defined by the direction from a bond pad to a corresponding lead. The bonding wire may extend along the bonding path. For any given set of corresponding bond pads and leads, the bonding path may extend in the X or Y direction, or be offset by an angle from either the X or Y direction.

In order to electrically couple the integrated circuit chip to the leads of the lead frame, a wire bonding technique is often used. A wire bonding machine may have a spool of bonding wire mounted on the machine. The bonding wire may be threaded through a capillary which is mounted to a horn of the wire bonding machine. The horn may be manipulated to move the capillary both vertically and horizontally. Typically, the wire bonding machine includes a device for heating or applying a spark to an end of the bonding wire which protrudes from an exit end of the capillary. The molten wire may form the shape of a ball which is placed on a target bond pad by manipulating the horn to move the capillary.

After this bond pad bond is created, a sufficient amount of bonding wire is released to allow the capillary to be moved to a location near an inner end of a target lead of the lead frame. The capillary is manipulated to connect the bonding wire to the inner end of the target lead and cut off the bonding wire so that the bonding wire protruding from the exit end of the capillary is now free to form a new wire bond between a new target bond pad and target lead. Any type of suitable bond may be made at either the bond pad or the lead, including ball bonds, stitch bonds and wedge bonds. A ball bond may be used, for example, at the bond pad. A stitch bond may be used, for example, at the lead. To complement the bonding process the package may be heated. Also, ultrasonic energy may be applied.

Problems in wire bonding techniques arise in part from the desire to increase the number of leads in a given package and to make integrated circuit chip packages smaller and smaller. This may require that the bonding pads located on the chip be made smaller and be spaced closer together. The same can be said for the leads on a lead frame.

The exit end of a wire bonding capillary is often referred to as the capillary face. Previous capillaries have had a circular face. A disadvantage of having a capillary with a circular face is that the spacing between bonds is limited. After a bond is made at a particular bond pad, for example, if the adjacent bond pad is too close then the capillary face may strike the ball bond which has been made at the first bond pad during the process of making a bond on the adjacent bond pad. One method for solving this shortcoming is to use a wire bonding capillary with a non-circular face. This type of approach is shown, for example, in U.S. Pat. No. 5,544,804 issued to Test et al., which is hereby incorporated by reference for all purposes. The Test et al. patent shows a BowTI™ capillary having a non-circular face. The face of a BowTI™ capillary may have a shape which includes a pair of opposed convex sides joining a pair of opposed concave sides. The BowTI™ capillary may be generally described as having a longitudinal axis extending across the midpoints of the convex sides and through the center of the BowTI™. The BowTI™ capillary allows ball bonds, for example, to be made closer to one another than with a circular capillary face. This can be accomplished because the concave sides avoid striking adjacent bonds. The BowTI™ capillary can also make other types of bonds including stitch bonds.

A need arising from the use of capillaries having non-circular faces is precise alignment of the longitudinal axis of the capillary face along either the X or Y direction of the lead frame, or along the longitudinal axis of a target lead, or along a given bonding path as necessary. Precise alignment of non-circular capillaries is especially difficult due to the relatively small size of a typical capillary face (e.g., 4–8 mils). Improper alignment of the capillary, particularly in view of the decreasing size of integrated circuit chip packages, can lead to defective wire bonds during the manufacturing process. This can result from many factors including improper positioning of the capillary face over the bond pad, the lead or both. Defective wire bonding can also occur when improper alignment causes the capillary to strike and/or damage an existing bond during the formation of a subsequent bond.

Typical wire bonding equipment and wire bonding techniques do not ensure precise alignment of the capillaries upon installation of the capillaries onto, for example, the horn of the wire bonding machine. Typically, a capillary is removed from a package and is manually inserted onto the horn by holding the capillary in one's fingers and placing it into the mounting receptacle of the horn. With conventional capillary installation techniques, it is difficult to ensure that the capillary is in a desired location along its longitudinal axis with respect to the horn. Also, conventional installation processes do not ensure precise rotational alignment of the capillary about its longitudinal axis.

Improper alignment of the capillary, particularly in view of the decreasing size of integrated circuit chip packages, can lead to defective wire bonds during the manufacturing process. This can result from many factors including improper positioning of the capillary face over the bond pad, the lead or both. Defective wire bonding can also occur when improper alignment causes the capillary to strike and/or damage an existing bond during the formation of a subsequent bond. Other problems, shortcomings and disadvantages of known capillaries and wire bonding techniques exist.

SUMMARY OF THE INVENTION

It is an object of the present invention to address the needs associated with wire bonding equipment and wire bonding techniques.

It is another object of the present invention to provide an apparatus which cooperates with the horn of a wire bonding machine in order to assist in the installation of a capillary onto the horn.

It is another object of the present invention to provide an apparatus to assist in aligning a capillary along its longitudinal axis with respect to a horn of a wire bonding machine.

It is another object of the present invention to provide an apparatus to assist in aligning a capillary about its longitudinal axis with respect to a horn of a wire bonding machine.

To accomplish these and other objects of the present invention, and in accordance with a first embodiment of the present invention, an apparatus is provided for installing a wire bonding capillary onto a horn of a wire bonding machine. The apparatus includes a first arm and a second arm coupled to the first arm. The first and second arms are adapted to grip the horn therebetween. The apparatus also includes a support which is coupled to at least one of the first and second arms. The support holds the capillary in a predetermined position relative to the horn.

According to a second embodiment of the present invention, an apparatus is provided for mounting a wire bonding capillary onto the horn of a wire bonding machine. The apparatus includes first and second arms which are coupled together and are adapted to grip the horn therebetween. The apparatus also includes a capillary holder which holds the capillary by contact between the holder and a surface of the capillary. The apparatus also includes a rotator which rotates the capillary holder to rotate the capillary about a longitudinal axis of the capillary.

According to an aspect of this embodiment, the capillary may have one or more indicators located thereon. The one or more indicators may cooperate with a detector, such as a transducer, to indicate a rotational position of the capillary.

According to a feature of the present invention, the first and second arms may be coupled at first ends thereof and the second ends thereof are moveable toward one another to grip the horn between the first and second arms. According to another feature, the horn includes a locking mechanism for locking the capillary to the horn. The first and the second arms are coupled by a bridge. The bridge has an opening formed therein for accessing the locking mechanism of the horn. According to another feature, the apparatus includes at least one locking device for locking the first and second arms against the horn to grip the horn therebetween. According to an aspect of this feature, the at least one locking device is a locking ring.

A technical advantage of the present invention is that it ensures proper and precise alignment and realignment of capillaries during capillary installation and during the wire bonding process.

Another technical advantage of the present invention is that the alignment apparatus may be easily constructed.

Another technical advantage of the present invention is that the alignment apparatus is designed to cooperate with known horns of known wire bonding machines.

BRIEF DESCRIPTION OF THE DRAWINGS

For a more complete understanding of the present invention and the advantages thereof, reference is now made to the following detailed description in conjunction with the accompanying drawings, wherein like reference numerals represent like parts, in which:

FIG. 1 is horn of a wire bonding machine;

FIG. 2 is the horn of FIG. 1 viewed from the direction of arrows 2—2;

FIG. 3 is an alignment apparatus in accordance with a first embodiment of the present invention;

FIG. 4 is the alignment apparatus of FIG. 3 viewed from the direction of arrows 4—4;

FIG. 5 is a cross-sectional view of the alignment apparatus of FIG. 4 taken along arrows 5—5;

FIG. 6 is an alignment apparatus in accordance with a second embodiment of the present invention; and FIG. 7 is the alignment apparatus of FIG. 6 viewed in the direction of arrows 7—7.

DETAILED DESCRIPTION OF THE INVENTION

In general, the present invention includes improved wire bonding methods and equipment. A wire bonding system may include a wire bonding machine which has a horn. A capillary is mounted into the horn and guides bonding wire from a source to various bonding points on the integrated circuit chip package. The capillary may have one or more indicators located thereon which provide one or more signals to be received by one or more detectors spaced from the capillary. The signals indicate the rotational alignment of the capillary. Therefore, the signal also indicates the direction of an axis of the face of the capillary. Each signal may have a relative signal strength which indicates an angular offset of the capillary face compared to a predetermined, desired alignment.

During operation, the capillary may be rotated to a first rotational alignment at which the capillary face axis extends in a first direction. A first signal received by the detector indicates when the first rotational alignment has been achieved. A first bond may then be made at a first bond point (e.g., at a bond pad on the integrated circuit chip) by guiding the capillary to the first bond point.

The capillary may then be realigned by rotating the capillary to a second rotational alignment so that the capillary face axis extends in a second direction different from the first direction. A second bond may then be made at a second bond point (e.g., at a lead on the lead frame) by guiding the capillary to the second bond point.

The capillary may then be rotated back to the first direction or to a third direction for a subsequent bond (e.g., at a second bond pad on the integrated circuit chip). Rotation of the capillary is achieved by the cooperation of the indicators and detectors and the production of signals which indicate rotational alignment and realignment. The ability to precisely rotate the capillary is especially beneficial for capillaries with non-circular faces. An axis of a non-circular face is ideally aligned in the direction of bonding when a bond is made. For example, it may be desirable to align the capillary face axis along the lead axis. Furthermore, as wire bonds are made around an integrated circuit chip package, the direction of bonding may change. The present invention is adapted to changing bonding directions. Further aspects of an overall capillary alignment system are disclosed in U.S. patent application Ser. No. 08/993,638 (Attorney Docket No. TI-24970) which is assigned to Texas Instruments Incorporated. This application was filed on Dec. 19, 1996 and is hereby incorporated by reference for all purposes.

The present invention also provides an apparatus which is designed to ensure proper alignment of a capillary during installation of the capillary onto the horn of a wire bonding machine. The apparatus cooperates with the horn and is placed onto the horn during the installation process. In at least one embodiment, the apparatus includes a pair of opposed arms which are moveable toward one another to grip the horn therebetween. The apparatus also includes a support for holding the capillary in a predetermined position relative to the horn. When the apparatus is placed onto the horn and is properly positioned on the horn, a capillary may be inserted into the support of the apparatus and will be in the predetermined position. The capillary may then be locked onto the horn.

A horn of a wire bonding machine (not shown) is depicted in FIG. 1. Horn 200 preferably has at least one first alignment marker 230. As shown in FIG. 1, horn 200 may have a plurality of first alignment markers 230. Markers 230 may be, for example, markers which are inscribed on horn 200. Preferably, first alignment marker 230 are etched into an outer surface of horn 200. Also, it is preferred that markers 230 are of a color and/or shade which is distinct from the color of horn 200. Although markers 230 are shown as solid lines, they may have other forms. For example, markers 230 may be dashed or dotted lines. Also, markers 230 may consist of raised ridges. Any markers are suitable so long as they provide an indication of proper positioning of an alignment apparatus on horn 200 as described in greater detail below.

Horn 200 also has a capillary mounting receptacle 205 for mounting a capillary 210 as shown. Mounting receptacle 205 can be better seen in FIG. 2. As shown in FIG. 1, horn 200 also preferably includes a locking mechanism 220 for selectively locking capillary 210 into mounting receptacle 205. Locking mechanism 220 comprises a locking screw as shown in FIG. 1. However, other types of locking mechanisms may be used, including, without limitation, a latch arrangement (not shown) so long as locking mechanism 220 functions to hold capillary 210 in place within the mounting receptacle 205. Preferably, the locking mechanism may be selectively deactivated so that the capillary may be freely rotated if desired.

Capillary 210 may be any type of capillary used in the wire bonding process. Capillary 210 has a longitudinal axis which generally extends along a centerline of the interior space of capillary 210. Capillary 210 is preferably tubular in shape, having an outer surface and an inner surface, such that a bonding wire may be passed through an interior of capillary 210.

An alignment apparatus, in accordance with the present invention, is shown in greater detail in FIGS. 3–7. In a first embodiment, as shown in FIGS. 3–5, apparatus 300 includes a first arm 301 coupled to a second arm 302. First arm 301 has a first end 303 and a second end 304. Second arm 302 has a first end 305 and a second end 306. Preferably, first and second arms 301 and 302 are coupled at the first ends 303 and 305 thereof. Preferably, the first and second arms 301 and 302 are coupled at only one end so that the uncoupled ends are free to move toward one another. This permits apparatus 300 to grip horn 200 between first and second arms 301 and 302.

First and second arms 301 and 302 may be coupled by a bridge 308 as shown in FIGS. 3 and 4. Preferably, bridge 308 has a stepped portion 309. Stepped portion 309 has an opening 320 formed therethrough. Opening 320 permits access to locking mechanism 220 when apparatus 300 is placed onto horn 200.

First and second arms 301 and 302 are each preferably adapted to conform to the shape of horn 200. Horn 200, for example, may have a conical shape. Therefore, as shown in FIG. 5, first arm 301 preferably has an inner surface 31 which corresponds to the outer surface of horn 200 along at least a portion of the outer surface of horn 200. Preferably, second arm 302 has an inner surface 32 which is similarly configured to correspond to at least a portion of the outer surface of horn 200.

As shown in FIGS. 3 and 4, the portions of first and second arms 301 and 302, which have inner surfaces corresponding to horn 200, define engagement regions 33 and 34, respectively. The engagement regions 33 and 34 preferably engage the outer surface of horn 200 when apparatus 300 is placed onto horn 200 and is properly positioned thereon. Nonengagement portions 35 and 36 of first and second arms 301 and 302, respectively, are spaced from the outer surface of horn 200.

To form the corresponding surfaces, as shown more clearly in FIG. 5, each of first and second arms 301 and 302 preferably has at least a portion of its inner surface shaped as a concave shape to match a corresponding portion of the outer surface of horn 200. More preferably, each of first and second arms 301 and 302 has an arcuate cross section which defines inner surfaces 31 and 32. At second ends 304 and 306 of first and second arms 301 and 302, the arcuate cross sections formed generally semicircular shapes. Thus, when apparatus 300 is properly positioned on horn 200, first and second arms 301 and 302 cooperate to substantially surround horn 200. Moving toward first ends 303 and 305, the cross-sectional surface area of each arm 301 and 302 is reduced. Thus, the first and second arms 301 and 302 are each flared from the first end 303 and 305 thereof to the second end 304 and 306 thereof, respectively.

It should be noted that the precise shape of first and second arms 301 and 302 may be changed and still function to grip horn 200. For instance, if the horn comprises a shape different from a cone, the first and second arms may have a different shape such that inner surfaces thereof correspond to the outer surface of the horn. Also, the first and second arms may have inner surfaces which do not correspond to the outer surface of the horn. For instance, if the arms are urged toward one another and onto the horn with sufficient force, the arms can grip the horn even if their inner surfaces do not correspond to the horn. For example, the inner surface may comprise teeth or a flat surface. Moreover, apparatus 300, including its first and second arms, may be formed from a number of different types of material so long as the arms can grip horn 200. Thus, first and second arms 301 and 302 are of any suitable shape and material such that when the arms are moved toward one another, the arms engage the horn and can be locked into engagement with the horn. Also, the dimensions of the engagement portions and nonengagement portions of first and second arms 301 and 302 may be varied.

Preferably, apparatus 300 is provided with at least one locking device 360. As shown in FIGS. 3 and 4, for example, two locking devices 360 are provided. Locking devices 360, as shown, are locking rings. Locking rings 360 are preferably adapted to lock the first and second arms 301 and 302 into engagement with the other surface of horn 200. Preferably, each locking ring 360 is moveable from a first position in which arms 301 and 302 do not engage horn 200 to a second position in which arms 301 and 302 engage horn 200. In the configuration shown in FIGS. 3 and 4, locking rings 360 would be movable toward first ends 303 and 305 to unlock arms 301 and 302 from horn 200, and would be movable toward second ends 304 and 306 to lock arms 301 and 302 into engagement with horn 200.

Other types of locking devices may be used. Also, apparatus 300 may be constructed so that arms 301 and 302 grip horn 200 without the aid of locking devices. For example, in a rest state, apparatus 300 is disengaged from horn 200. In the rest state, the smallest distance between arms 301 and 302 may be lest than the thickness of horn 200 at its thickest point. In a holding state, apparatus 300 is placed onto horn 200. If apparatus 300 is placed onto horn 200 such that the arms contact the horn at the above-described points, then the arms will actually be forced apart by the horn. Thus, the apparatus itself will provide an inherent reaction force to hold the arms into engagement with the horn.

Preferably apparatus 300 has at least one second alignment marker 330, which may be formed in a similar manner as that described in connection with first alignment markers 230 of horn 200. When apparatus 300 is placed onto 200 and apparatus 300 is in a proper position relative to horn 200, second alignment markers 330 are aligned with first alignment markers 230. Because first and second arms 301 and 302 are flared from first to second ends thereof, an open space 370 exists in which one can view first markers 230 of horn 200. Alternatively, the second markers 330 may comprise slots through which the first alignment markers are viewed.

A support 310 is preferably coupled to at least one of the first and second arms 301 and 302. As shown, in FIG. 4, for example, support 310 is coupled to the first ends 303 and 305 of both first and second arms 301 and 302. Alternatively, support 310 may be coupled to bridge 308. Support 310 may be formed separately and coupled to apparatus 300 or may be integrally formed as part of apparatus 300. Regardless of the location of support 310 on apparatus 300, support 310 is preferably adapted to receive a capillary therein and hold the capillary in a predetermined position relative to horn 200. Thus, when apparatus 300 is placed onto horn 200 and properly positioned thereon, capillary 210 held by support 310 will be in a predetermined position with respect to horn 200.

Preferably, the predetermined position is that in which capillary 210 is in correct alignment with respect to a bonding platform (not shown) of the wire bonding machine (not shown) and/or lead frames (not shown) which are undergoing the wire bonding process. Thus, support 310 ensures that capillary 210 is in a precise, fixed position along its longitudinal axis with respect to horn 200 and is also in the correct position with respect to a horizontal plane defined by the bonding platform and/or the lead frames. Preferably, when capillary 210 is aligned properly, the longitudinal axis of capillary 210 is perpendicular to the horizontal plane defined by the bonding platform and/or the lead frames.

Support 310 may be formed as a cup-shaped member as shown. Thus, support 310 has an open end and a closed end. A cylindrical sidewall extends from the closed end to the open end. Preferably, the open end is spaced from the closed end in a direction away from the lead frames and/or bonding platform when apparatus 300 is properly positioned on horn 200. Support 310 also preferably has an aperture 311 formed in the sidewall thereof. Aperture 311 extends from the open end of support 310 at least partially toward the closed end of support 310. Preferably, aperture 311 extends completely to the closed end of support 310. Preferably, a width of aperture 311 is at least slightly larger than a width of capillary 210 to allow the passage of capillary 210 through aperture 311 when apparatus 300 is removed from horn 200 after capillary 210 is locked into mounting receptacle 205. Preferably, the inner space of support 310 is slightly larger in dimension than the outer surface of the corresponding portion of capillary 210. This allows capillary 210 to be inserted into support 310, while still allowing rotation of capillary 210 about its longitudinal axis. The configuration of support 310 should be adapted to limit movement of capillary 210 in at least one direction along its longitudinal axis. The sidewall of support 310 also substantially limits movement of capillary 210 away from a longitudinal axis of support 310 (e.g., horizontal movement).

The use of apparatus 300 in the process of installing capillary 210 onto horn 200 will now be described. Prior to installation, locking mechanism 220 is preferably in an unlocked position. Apparatus 300 is placed onto horn 200 and first alignment markers 230 are aligned with second alignment markers 330. Preferably, apparatus 300 is also properly aligned with respect to its position about a longitudinal axis of horn 200. This ensures that a longitudinal axis of capillary 210 will be perpendicular to the lead frames during the bonding process. However, once capillary 210 is locked into mounting receptacle 205, the longitudinal axis of capillary 210 will be in the proper alignment with respect to horn 200. Therefore, the alignment of apparatus 300 about the longitudinal axis of horn 200 is not critical and may be offset slightly so long as the offset is not of such a degree as to damage capillary 210 by, for example, bending during the process of locking capillary 210 into mounting receptacle 205.

Once apparatus 300 is properly positioned on horn 200, locking devices 360 are moved to the locked position to lock inner surfaces 31 and 32 into engagement with the outer surface of horn 200. A capillary 210 may then be inserted into support 310 through receptacle 205. Because apparatus 300 is properly positioned with respect to horn 200, capillary 210 is held by support 310 in a fixed, predetermined position which defines proper alignment of capillary 310 with respect to horn 200. That is, capillary 210 is in the proper position along its longitudinal axis with respect to horn 200. This is accomplished because support 310 limits the movement of capillary 210 in at least one direction along the longitudinal axis of capillary 210. Preferably, support 310 also substantially limits sideways movement of capillary 210 (e.g., movement away from a longitudinal axis of a cup-shaped support 310). Locking mechanism 220 is accessed through opening 320 to lock capillary 210 into receptacle 205 of horn 200.

In a second embodiment of the present invention, as shown in FIGS. 6 and 7, apparatus 300 includes additional components which aid in establishing precise rotational alignment of capillary 210 with respect to horn 200. Apparatus 300 includes a capillary holder 250. Capillary holder 250 preferably includes a base portion 251 and extensions 252 extending therefrom to grip the outer surface of capillary 210. However, other holder configurations may be used. Base 251 is preferably disc-shaped as shown in FIG. 6.

Base portion 251 is adapted to cooperate with a rotator 253. For example, rotator 253 may consist of a gear which has teeth interfitting with a gear provided on base 251. Alternatively, rotator 253 may rotate base 251 by frictional contact therebetween. For example, if rotator 253 and base 251 are formed from an elastomer, then rotator 253 tends to grip base 251 as it rotates.

Rotator 253 is coupled to drive means 255 by axle 254. Drive means 255 may comprise any suitable drive means for rotating axle 254 to thereby rotate rotator 253. For example, drive means 255 may comprise a motor or simply a wheel which may be manually turned by an operator. Bracket 350 is provided to support axle 254 and, thereby, to support rotator 253 in a proper position to cooperate with capillary holder 250 during the process of rotating capillary 210. Bracket 350 may be provided as a separate component which is attached to apparatus 300. Alternatively, bracket 350 may be integrally formed as a part of apparatus 300. Bracket 350 may be provided, for example, at a first end 303 of first arm 301.

Rotation of drive means 255 rotates axle 254 which in turn rotates rotator 253. When rotator 253 is in contact with base 251 of capillary holder 250, rotation is imparted to base 251. When capillary holder 251 and capillary 210 are in contact, the rotation is imparted to capillary 210 to cause capillary 210 to rotate about its longitudinal axis. Thus, capillary 210 may be rotated to a desired rotational alignment with respect to horn 200 and, therefore, with respect to the mounting platform. Therefore, capillary 210 may be aligned and realigned so that an axis of the capillary face may extend along any of various bonding directions during wire bonding.

According to an optional feature of this embodiment, capillary 210 may have one or more indicators incorporated into the body thereof to provide a sensing function. The indicators may be of any type including active, passive, mechanical, electrical, optical, magnetic, and others. Additionally, one or more detectors may be provided to receive one or more signals from the indicators on capillary 210. The signals indicate rotational alignment of capillary 210. For example, in the arrangement shown in FIGS. 6–7, a first indicator (not shown) may comprise a paint strip of reflective marking which may be optically detected by an optical detector. The marker may be aligned along the axis of the face of capillary 210. A detector, for example transducer 340, may optically detect the marker and produce a corresponding electrical detection signal. Preferably, the position of transducer 340 is predetermined so that when transducer 340 detects the appropriate indicator, the axis of the face of capillary 210 is precisely aligned in the desired direction of bonding. The electrical signal from transducer 340 may be passed to a display (not shown) to indicate that capillary 210 is properly aligned. As the bonding direction changes, the capillary may be realigned by rotating the capillary until appropriate signals are received by the one or more detectors from the one or more indicators.

Thus, the sensing components cooperate to provide signals, which may be used to determine the rotational position of capillary 210, and to establish precise rotational alignment and realignment of capillary 210. Alternatively, the sensing devices may cooperate to provide a signal with a relative signal strength. For example, the signal may be stronger when the indicator and the detector are in closest proximity to one another. The signal may weaken as these two elements are separated by rotation of capillary 210. The strength of the sensed signal would indicate an amount of angular offset from a predetermined rotational alignment of capillary 210.

According to one aspect of this feature, transducer 340 may provide feedback to drive means 255. For example, transducer 340 may be electrically connected through drive means 255 to the rotator 253 to cause rotator 253 to rotate capillary 210 in response to the rotational position of the capillary.

Transducer 340 may be provided as a separate component and may be spaced from apparatus 300 while providing the sensing function. Optionally, transducer 340 may be mounted on apparatus 300, for example, at a first end 305 of second arm 302 and generally opposite from bracket 350.

During operation of apparatus 300 according to the second embodiment, apparatus 300 may be placed onto and properly aligned with horn 200 as described above in connection with the first embodiment. Also, as described above, a capillary 210 is inserted through receptacle 205 and into support 310. Capillary 210 may be inserted into support 310 with capillary holder 250 already attached.

Alternatively, capillary holder 250 may be coupled to capillary 210 after capillary 210 is inserted into support 310. Drive means 255 is rotated to rotate axle 254 thereby also rotating rotator 253. Rotator 253 engages capillary holder 250 thereby imparting rotation of rotator 253 to capillary holder 250 to rotate capillary 210. The at least one indicator on capillary 210 cooperates with the at least one detector (e.g., transducer 340) to determine whether capillary 210 is in the desired rotational alignment with respect to horn 200 and, therefore, with respect to the mounting platform of the wire bonding machine and/or a lead frame undergoing the wire bonding process. If capillary 210 is not properly aligned, then drive means 255 is powered to rotate capillary 210 until the sensing components cooperate to provide a signal indicating that proper rotational alignment has been achieved.

The present invention has thus been described in connection with the preferred embodiments. These embodiments are intended as examples only and it will be appreciated by those having ordinary skill in the art that modifications may be easily made to these embodiments without materially departing from the scope and spirit of the invention as defined by the appended claims.

What is claimed is:

1. An apparatus for installing and aligning a wire bonding capillary onto a horn of a wire bonding machine, the apparatus comprising:
   a first arm;
   a second arm coupled to the first arm, the first and second arms being adapted to grip the horn therebetween; and
   a support, coupled to at least one of the first and second arms, for holding a capillary in a predetermined position relative to the horn.

2. The apparatus of claim 1, the first and second arms each having first and second ends and being coupled at the first ends thereof.

3. The apparatus of claim 2, wherein the horn includes a locking mechanism for locking the capillary onto the horn, the first ends of the first and second arms being coupled by a bridge, the bridge having an opening formed therein for accessing the locking mechanism.

4. The apparatus of claim 2, wherein the second ends of the first and second arms are movable toward each other to grip the horn between the first and second arms.

5. The apparatus of claim 1, the first and second arms movable toward each other to grip the horn therebetween.

6. The apparatus of claim 1, further comprising at least one locking device for locking the first and second arms against the horn to grip the horn between the first and second arms.

7. The device of claim 6, the at least one locking device comprising at least one locking ring at least partially disposed about the first and second arms and movable between an open position and a closed position, wherein when the at least one locking device is in the closed position, the first and second arms are held in contact with the horn.

8. The apparatus of claim 1, further comprising a holder coupled to the capillary and a rotator for rotating the holder to rotate the capillary about a longitudinal axis of the capillary.

9. The apparatus of claim 1, the first and second arms each having an inner surface shaped to correspond to an outer surface of the horn.

10. The apparatus of claim 1, the first and second arms each having an arcuate cross section.

11. The apparatus of claim 1, the first and second arms each having first and second ends and each being flared from the first end toward the second end.

12. The apparatus of claim 1, wherein the capillary has at least one indicator, the apparatus further comprising at least one detector for receiving a signal from the at least one indicator to indicate a rotational alignment of the capillary.

13. The apparatus of claim 12, the at least one detector comprising at least one transducer electrically connected to the rotator to cause the rotator to rotate the capillary in response to a rotational position of the capillary.

14. The apparatus of claim 1, wherein the horn has at least one first alignment marker thereon, at least one of the first and second arms having at least one second alignment marker thereon, wherein when the at least one first alignment marker is aligned with the at least one second alignment marker, the apparatus is in a predetermined position relative to the horn.

15. An apparatus for holding a capillary in a predetermined position relative to a horn of a wire bonding machine, the apparatus comprising:

a body portion adapted to engage the horn; and a capillary support coupled to the body portion for holding the capillary in the predetermined position when the body portion engages the horn;

the support being cup-shaped with an open end and a closed end, the support having an aperture in a side of the support, the aperture extending from the open end at least partially toward the closed end, the aperture adapted to allow the capillary to pass therethrough.

16. The apparatus of claim 15, the capillary being rotatable with respect to the support, the support adapted to limit movement of the capillary in at least one direction.

17. The apparatus of claim 15, the support adapted to limit longitudinal movement of the capillary in one direction, the support adapted to substantially limit horizontal movement of the capillary.

* * * * *